United States Patent
Nagashima

(10) Patent No.: US 6,665,952 B2
(45) Date of Patent: Dec. 23, 2003

(54) METHOD FOR HEAT PROCESSING OF SUBSTRATE

(75) Inventor: Shinji Nagashima, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/382,490

(22) Filed: Mar. 7, 2003

(65) Prior Publication Data

US 2003/0165787 A1 Sep. 4, 2003

Related U.S. Application Data

(62) Division of application No. 09/948,570, filed on Sep. 10, 2001, now Pat. No. 6,564,474.

(30) Foreign Application Priority Data

Sep. 11, 2000 (JP) ........................................ 2000-274646

(51) Int. Cl.[7] .................................................. F26B 7/00
(52) U.S. Cl. ........................................... 34/391; 34/638
(58) Field of Search .............................. 34/68, 72, 619, 34/629, 636, 638, 664, 391, 427; 432/5, 6, 81, 230, 247

(56) References Cited

U.S. PATENT DOCUMENTS 6,341,903 B1 * 1/2002 Ueda .......................... 396/611
6,413,317 B1 * 7/2002 Mikayazki et al. .......... 118/620
6,468,353 B1 * 10/2002 Perlov et al. ................ 118/724
6,474,986 B2 * 11/2002 Oda et al. .................... 432/247

* cited by examiner

*Primary Examiner*—Pamela A Wilson
(74) *Attorney, Agent, or Firm*—Oblon, Spivak, McClelland, Maier & Neustadt, P.C.

(57) ABSTRACT

The present invention relates to a method for subjecting a substrate on which a coating film is formed to heat processing, and the method comprises the steps of heating the substrate to a predetermined high temperature and decreasing the temperature of the substrate to a predetermined low temperature, wherein in the step of decreasing the temperature of the substrate to the low temperature, a first step of decreasing the temperature of the substrate from the predetermined high temperature to a predetermined intermediate temperature and a second step of decreasing the temperature of the substrate from the intermediate temperature to the predetermined low temperature are performed separately. In the present invention, the step of decreasing the temperature of the substrate, which is heated to the high temperature, to the predetermined low temperature is divided into two stages as described above, and hence compared with a case where the temperature of the substrate is rapidly decreased nonstop from the high temperature to the low temperature, the temperature decreasing speed of the substrate is reduced, whereby cracks, a warp, and the like caused by the rapid cooling of the substrate can be prevented.

6 Claims, 11 Drawing Sheets

METHOD FOR HEAT PROCESSING OF SUBSTRATE

BACKGROUND OF THE INVENTION

1. Field of the Invention

The present invention relates to a method and an apparatus for heat processing of a substrate.

2. Description of the Related Art

In the process of fabricating a semiconductor device, for example, an interlayer dielectric is formed by a so-called SOD (Spin on Dielectric) system. In this SOD system, coating processing for coating a semiconductor wafer with a coating solution, heat processing for vaporizing a solvent in the coating solution, cure processing for curing a coating film, and the like are performed.

The cure processing of the coating film is performed by heating the wafer, on which the coating film is formed, to a high temperature of approximately 450° C. to 500° C., for example, and rapidly cooling the wafer nonstop to a normal temperature of approximately 23° C., for example, in a processing unit in which a low-oxygen atmosphere is maintained so that the coating film formed on the wafer is not oxidized.

However, if the wafer with a high temperature of approximately 450° C. is rapidly cooled to the normal temperature of approximately 23° C., cracks, a warp, and the like are sometimes caused in the cured coating film. As a result, there is a fear of a drop in the quality of products and a decline in yield.

SUMMARY OF THE INVENTION

The present invention is made in view of the aforesaid point, and its object is to provide a heat processing method for preventing a sharp decrease in the temperature of a substrate such as a wafer in cooling processing after heating in cure processing of a coating film and the like and a heat processing apparatus for carrying out the heat processing method.

To attain the aforesaid object, a heat processing method of the present invention is a method for subjecting a substrate on which a coating film is formed to heat processing, comprising the steps of: heating the substrate to a predetermined high temperature; and decreasing the temperature of the substrate to a predetermined low temperature, wherein in the step of decreasing the temperature of the substrate to the low temperature, a first step of decreasing the temperature of the substrate from the predetermined high temperature to a predetermined intermediate temperature which is a temperature between the predetermined high temperature and the predetermined low temperature and a second step of decreasing the temperature of the substrate from the predetermined intermediate temperature to the predetermined low temperature are performed separately.

According to such a method for heat processing of the substrate, the step of decreasing the temperature of the substrate, which is heated to the high temperature, to the predetermined low temperature is divided into two stages, and hence the temperature of the substrate heated to the high temperature is first decreased from the predetermined high temperature to the predetermined intermediate temperature, and after reaching the intermediate temperature, decreased from the intermediate temperature to the predetermined low temperature. Thus, compared with the aforesaid case where the temperature of the substrate is rapidly decreased nonstop from the high temperature to the low temperature, the temperature decreasing speed of the substrate is reduced, whereby cracks, a warp, and the like caused by the rapid cooling of the substrate can be prevented.

If the first step further comprises the step of reducing the temperature decreasing speed, cracks and the like caused by rapid cooling can be further prevented. It should be mentioned that the temperature decreasing speed indicates the temperature of the substrate decreasing per unit hour. Moreover, it can be proposed that a reduction in temperature decreasing speed is controlled, for example, so that the set temperature of a heater for the substrate is gradually decreased and finally decreased to the aforesaid predetermined intermediate temperature.

A heat processing apparatus of the present invention is a heat processing apparatus for performing heat processing of a substrate, comprising: a first plate for mounting the substrate thereon and heating the substrate to a first predetermined temperature; and a second plate for mounting the substrate thereon and decreasing the temperature of the substrate to a second predetermined temperature lower than the first predetermined temperature, the second plate being provided with a heater for maintaining the second plate at the second predetermined temperature. It should be mentioned that the second predetermined temperature means a temperature not less than a normal temperature, for example, 23° C.

According to the apparatus for heat processing of the substrate, the substrate can be heated to the first predetermined temperature by the first plate, and thereafter the temperature of the substrate can be decreased to the second predetermined temperature by the second plate. Accordingly, the step of heating the substrate to the high temperature and the step of decreasing the temperature of the substrate from the high temperature to the intermediate temperature can be performed. As a result, the substrate which is heated can be cooled gradually in two stages, whereby cracks and a warp caused by rapid cooling of the substrate can be prevented.

DETAILED DESCRIPTION OF THE PREFERRED EMBODIMENT

Figure 1:
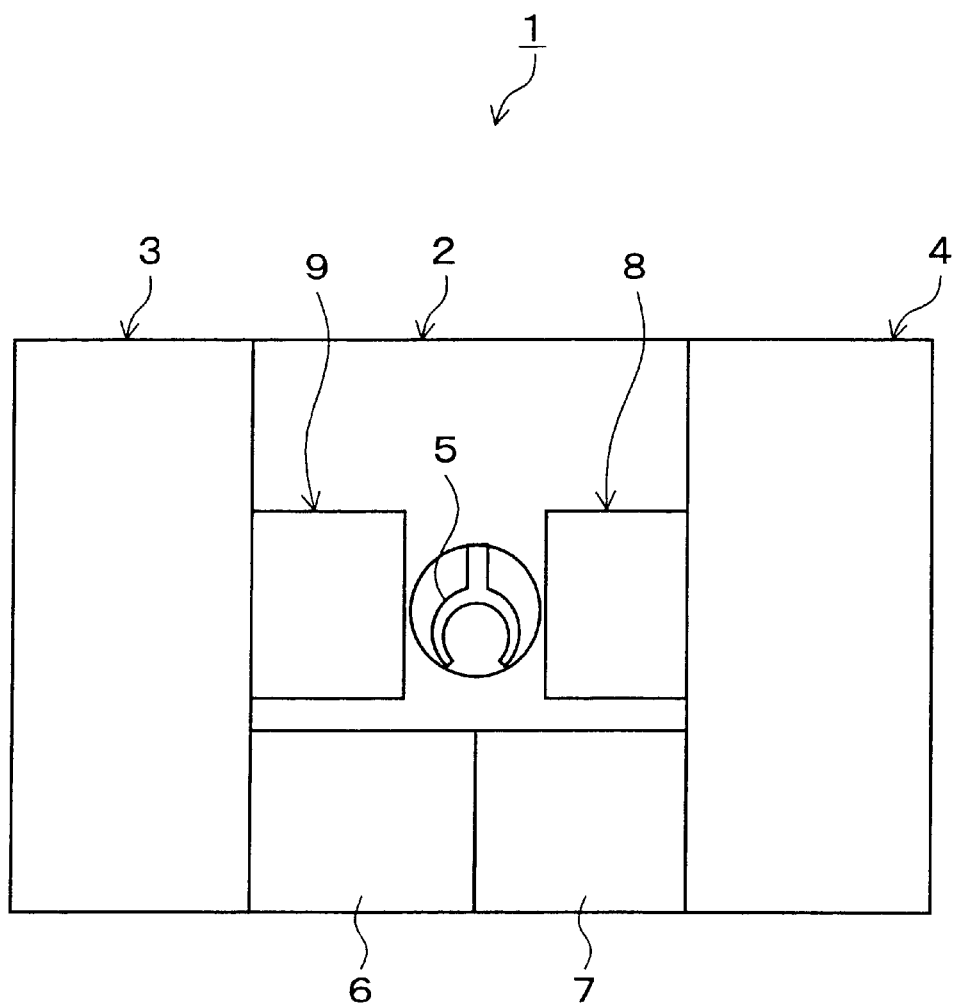
FIG. 1 is a plan view showing an outline of the structure of an SOD system into which a DCC processing unit according to the present embodiment is incorporated.

Hereinafter, the details of the present invention will be explained by explaining a preferred embodiment of the present invention with reference to the attached drawings. FIG. 1 is a plan view showing an outline of an SOD system 1 into which a heat processing apparatus according to this embodiment is incorporated.

This SOD system 1 comprises a processing section 2 in which a variety of processing mainly for forming an interlayer dielectric on a wafer W is performed, a side cabinet 3 which stores chemicals for performing the variety of processing and is a chemical supply source, and a carrier station 4 which delivers the wafer W between the outside of the SOD system 1 and the processing section 2.

In the processing section 2, for example as shown in FIG. 1, a main carrier unit 5 for carrying the wafer W between respective processing units is disposed in the center thereof, and a solvent exchange unit 6 for exchanging solvents and a coating processing unit 7 for supplying a coating solution onto the wafer W to form a coating film are disposed in front of the main carrier unit 5. Processing unit groups 8 and 9 in each of which various processing units are stacked in multiple tiers are disposed respectively on the carrier station 4 side and the side cabinet 3 side of the main carrier unit 5. The main carrier unit 5 is structured to be able to carry the wafer W into/out of the aforesaid respective carrier units in the processing section 2.

Figure 2:
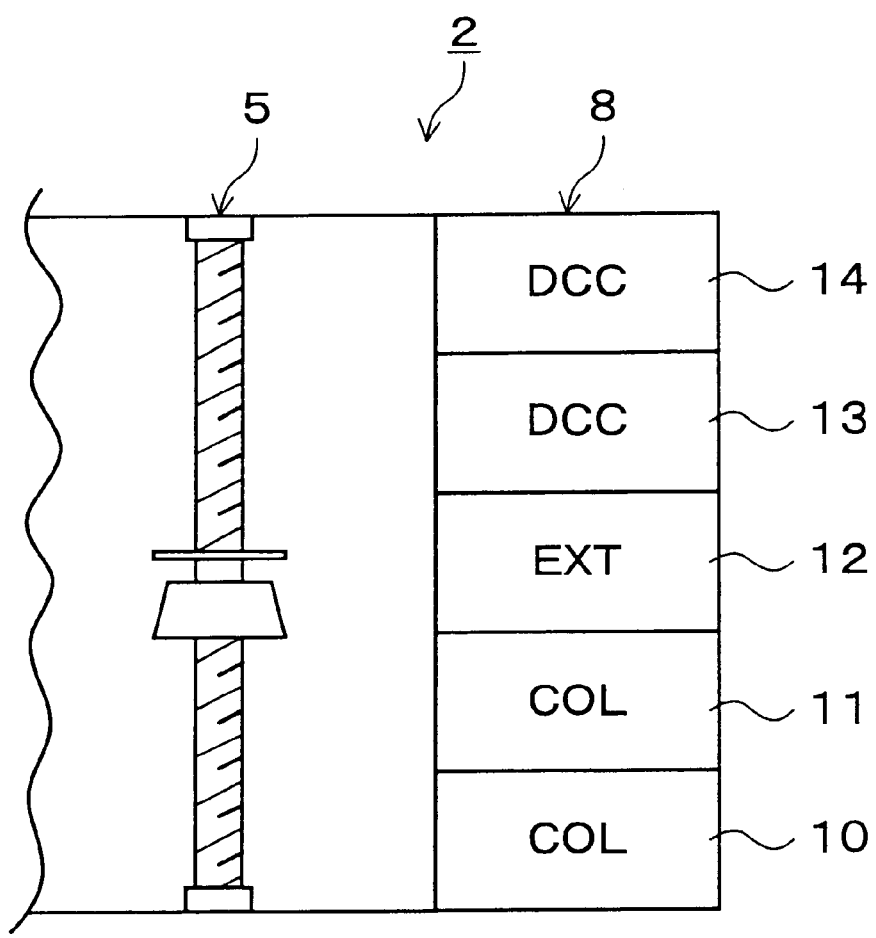
FIG. 2 is a side view showing an example of arrangement of units in one processing unit group provided in the SOD system shown in FIG. 1.

In the processing unit group 8, for example as shown in FIG. 2, cooling units 10 and 11 each for cooling the wafer W to a normal temperature, an extension unit 12 for delivering the wafer W, and DCC (Dielectric Cure and Cooling-off) processing units 13 and 14 as heat processing apparatus according to this embodiment, or the like are stacked in five tiers, for example, from the bottom in order.

Figure 3:
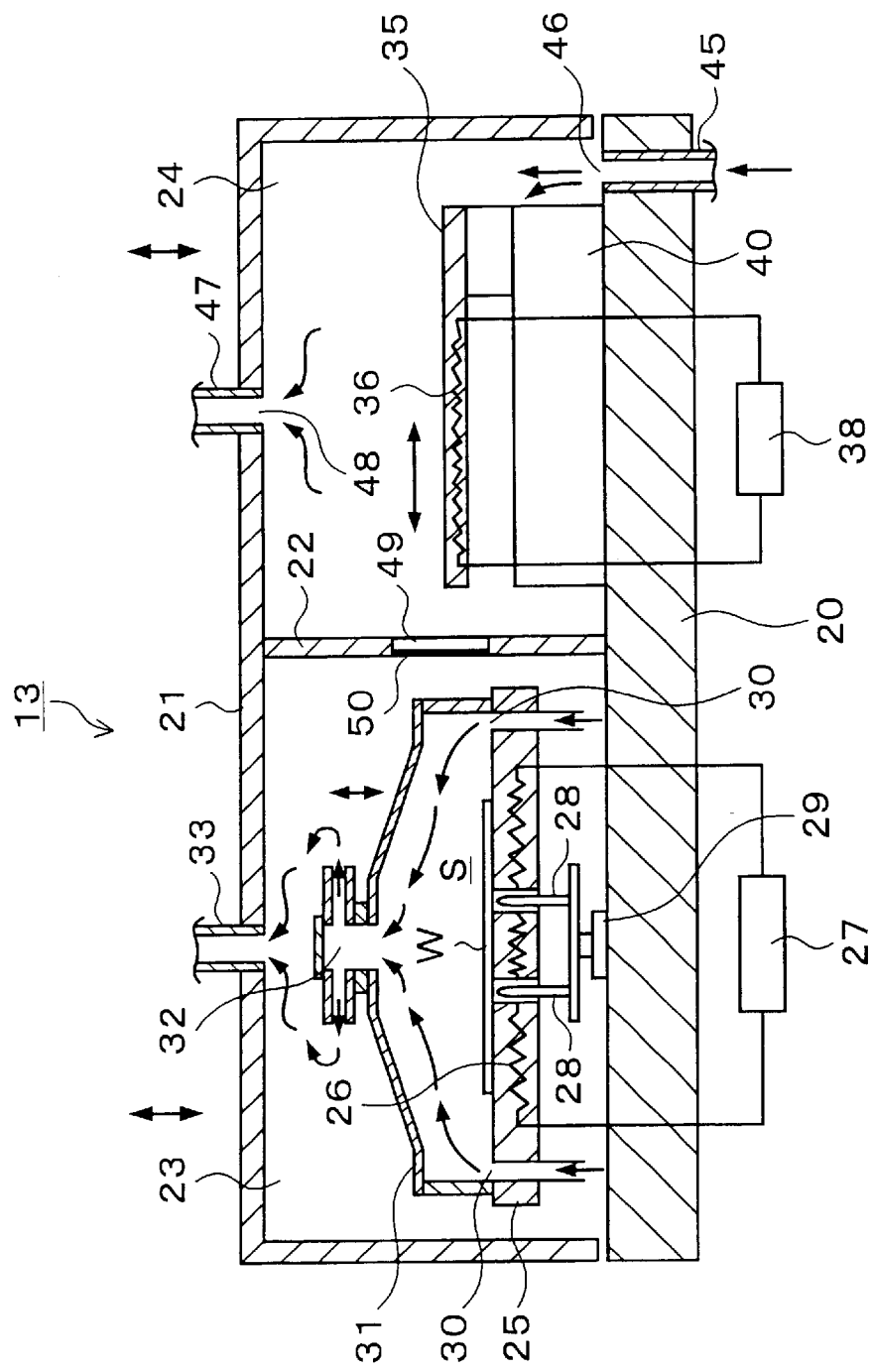
FIG. 3 is an explanatory view of a vertical section showing an outline of the structure of the DCC processing unit.
Figure 4:
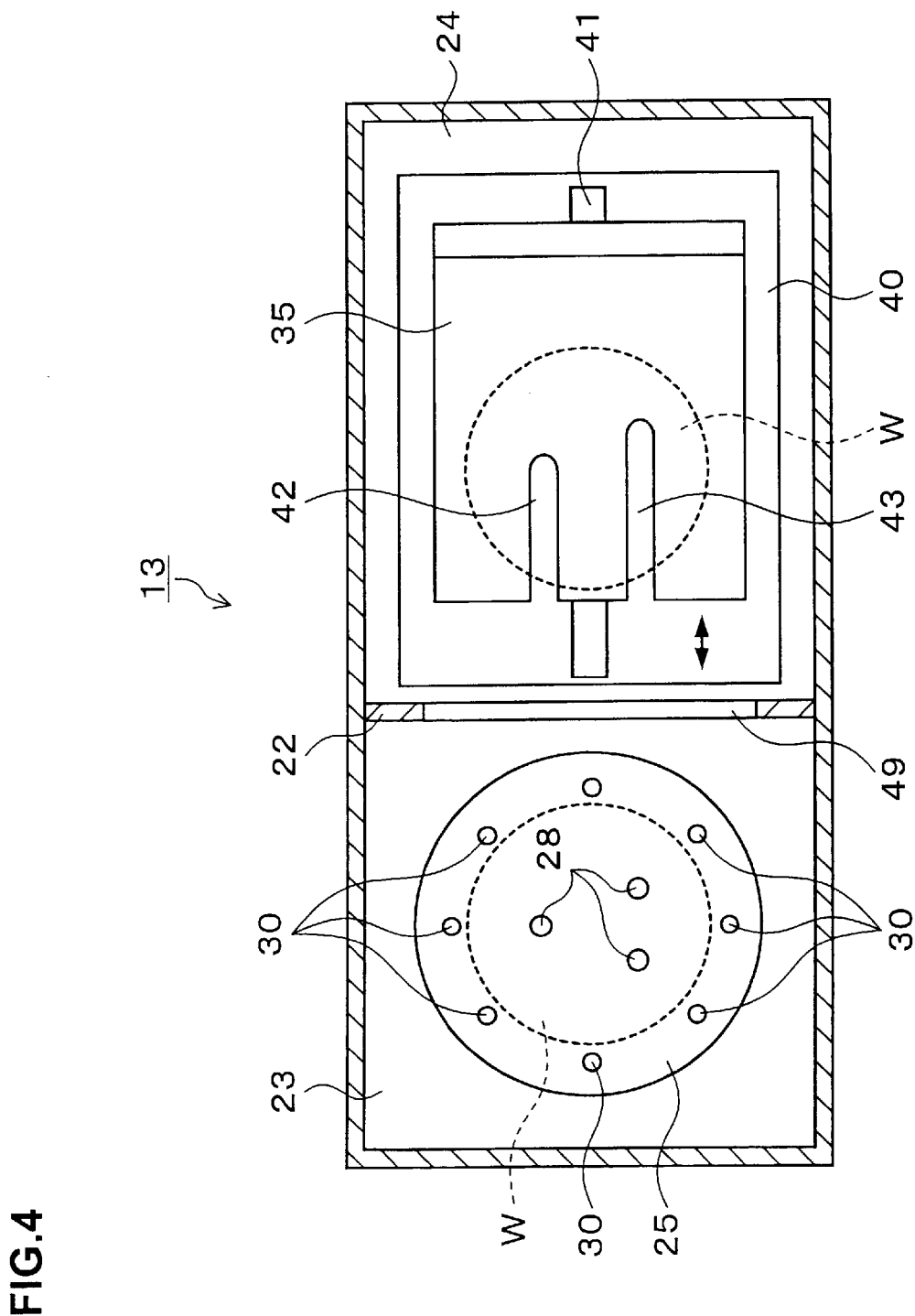
FIG. 4 is an explanatory view of a horizontal section showing an outline of the structure of the DCC processing unit.

Next, the structure of the aforesaid DCC processing unit 13 will be explained in detail. FIG. 3 is an explanatory view of a vertical section showing an outline of the DCC processing unit 13, and FIG. 4 is an explanatory view of a horizontal section of this DCC processing unit 13.

As shown in FIG. 3, the DCC processing unit 13 has a thick plate-shaped base 20 and a cover 21 which moves vertically and forms a processing chamber integrally with the base 20. A partition plate 22 is provided in the middle of the inside of the cover 21, and two processing chambers, that is, a high-temperature heating chamber 23 as a first processing chamber and a temperature decreasing chamber 24 as a second chamber are formed by the cover 21 and the base 20.

A heating plate 25 as a disc-shaped first plate for mounting a wafer W thereon and heating the wafer W is provided in the middle of the inside of the high-temperature heating chamber 23. A heater 26 as a heat source is embedded in the heating plate 25, and the heating value of the heater 26 is controlled by a temperature controller 27. Accordingly, the heating value of the heater 26 can be controlled based on a set temperature set by the temperature controller 27, and the temperature of the heating plate 25 can be maintained at the set temperature.

A plurality of raising and decreasing pins 28 for raising and decreasing the wafer W while supporting it when the wafer W is carried in and out are provided under the heating plate 25. The raising and decreasing pins 28 can be moved vertically by a raising and decreasing drive mechanism 29 so as to penetrate the heating plate 25 from under the heating plate 25 and protrude above the heating plate 25.

Blowout ports 30 for supplying an inert gas, for example, nitrogen gas upward are provided in a plurality of places at the outer peripheral portion of the heating plate 25, whereby an atmosphere in the temperature heating chamber 23 is exchanged with a nitrogen atmosphere, and a low-oxygen atmosphere with a predetermined concentration can be maintained therein.

A lid body 31 with its lower face open, which is vertically movable and forms a low-oxygen chamber S integrally with the heating plate 25, is provided above the heating plate 25, so that an atmosphere when the wafer W is heated can be controlled and maintained more strictly. A vent hole 32 for letting the nitrogen gas supplied into the low-oxygen chamber S go into the high-temperature heating chamber 23 is provided at the top of the lid body 31, so that an atmosphere in the low-oxygen chamber S can be exhausted while the high temperature heating chamber 23 is maintained at a low-oxygen concentration.

An exhaust pipe 33 for exhausting the atmosphere in the high-temperature heating chamber 23 is provided in the upper portion on the high-temperature heating chamber 23 side of the cover 21, and the nitrogen gas supplied from the blowout ports 30 and impurities produced from the wafer W are exhausted from the exhaust pipe 33. As a result, an ascending current is formed in the high-temperature heating chamber 23 at the time of heating.

A temperature decreasing plate 35 as a second plate for decreasing the temperature of the wafer W to a predetermined temperature after the wafer W is heated in the high-temperature heating chamber 23 is provided in the temperature decreasing chamber 24. As shown in FIG. 3 and FIG. 4, this temperature decreasing plate 35 has, for example, an almost square thin flat plate shape, and a heater 36 and a controller 38 for controlling the heating value of the heater 36 are provided therein. Hence, the temperature decreasing plate 35 can be maintained at the predetermined temperature by the control of this controller 38. Aluminum is used as material for the temperature decreasing plate 35, and consequently the weight of the temperature decreasing plate 35 can be lightened.

Figure 5:
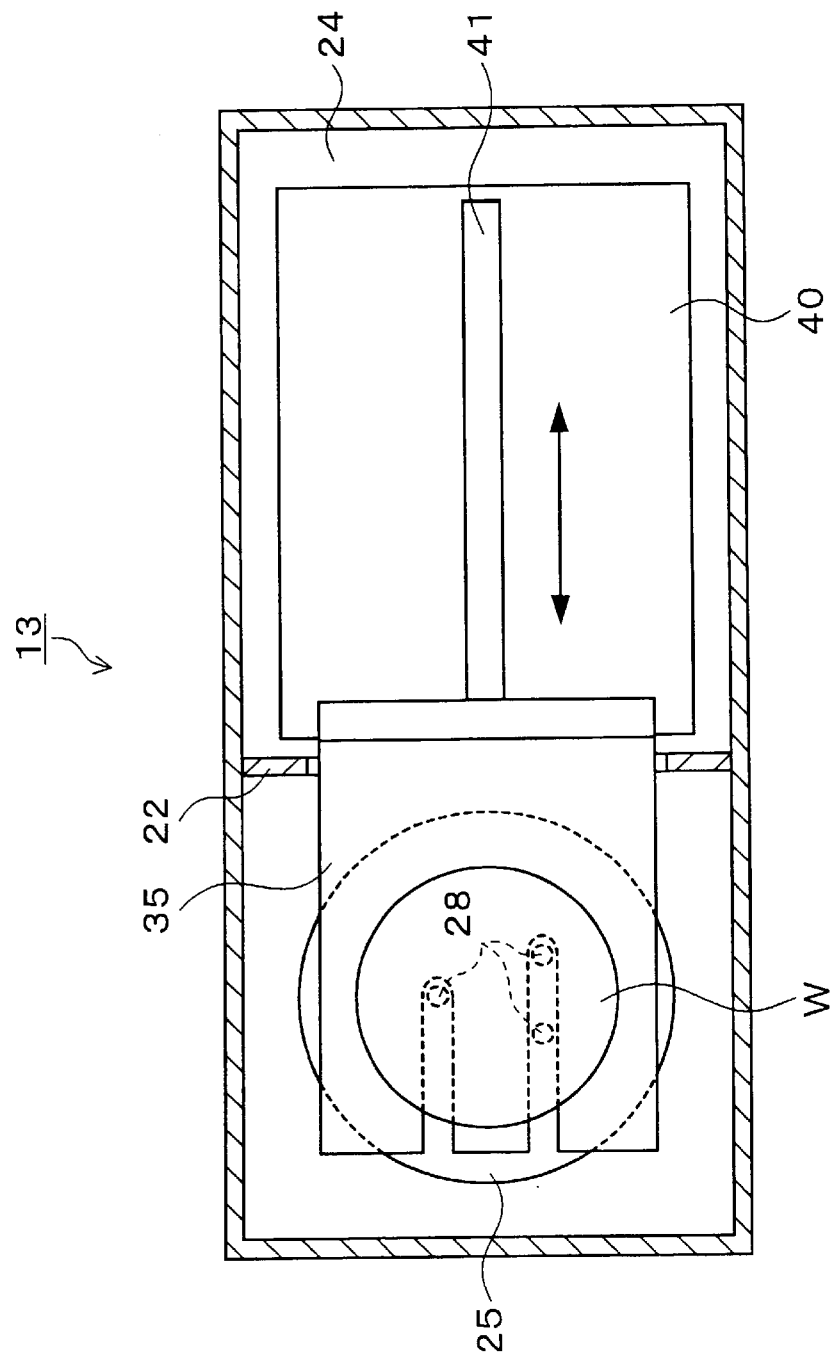
FIG. 5 is an explanatory view of a horizontal section of the DCC processing unit showing a state in which a temperature decreasing plate of the DCC processing unit is moved to the side of a high-temperature heating chamber.

The temperature decreasing plate 35 is supported by a supporting stand 40 on the base 20 and freely movable on a rail 41 extending toward the high-temperature heating chamber 23 so that it can move to a position above the heating plate 25 in the high-temperature heating chamber 23. As shown in FIG. 4, slits 42 and 43 are formed at an end portion on the heating plate 25 side of the temperature decreasing plate 35. These slits 42 and 43 prevent the ascending and descending pins 28 to be obstacles as shown in FIG. 5 when the temperature decreasing plate 35 moves to the position above the heating plate 25 and receives the wafer W supported by the ascending and descending pins 28 at the position above the heating plate 25. Accordingly, the temperature decreasing plate 35 is structured to be able to move to the position above the heating plate 25 and receive the wafer W above the heating plate 25.

A supply port 46 of a supply pipe 45 for supplying an inert gas, for example, nitrogen gas into the temperature decreasing chamber 24 is provided in the base 20 below the temperature decreasing plate 35 as shown in FIG. 3, so that a low-oxygen atmosphere with a predetermined concentration can be maintained in the temperature decreasing chamber 24.

An exhaust port 48 of an exhaust pipe 47 for exhausting an atmosphere in the temperature decreasing chamber 24 is provided in the upper portion on the temperature decreasing chamber 24 side of the cover 21, whereby an ascending current from the supply port 46 to the exhaust port 48 is formed in the temperature decreasing chamber 24 so that the impurities produced from the wafer W can be exhausted.

The aforesaid partition plate 22 which divides the high-temperature heating chamber 23 and the temperature decreasing chamber 24 is provided with a carrier opening 49 through which the temperature decreasing plate 35 passes when moving to the position above the heating plate 25, and the carrier opening 49 is provided with a shutter 50 for keeping the atmospheres in the respective processing chambers separate. The shutter 50 is opened only when the temperature decreasing plate 35 moves to the high-temperature heating chamber 23 side to carry the wafer W and closed except this occasion.

Next, the operation of the DCC processing unit 13 structured as above will be explained.

In the process of forming an interlayer dielectric performed in the SOD system 1, the wafer W, on which a coating solution is applied in the coating processing unit 7 and solvents are exchanged in the solvent exchange unit 6, is carried to the DCC processing unit 13 or 14 by the main carrier unit 5 to undergo cure processing of a coating film.

Incidentally, before the wafer W is carried into the DCC processing unit 13, the temperature of the heating plate 25 is maintained at a predetermined temperature $T_1$, for example, 450° C., and the temperature of the temperature decreasing plate 35 is maintained at a predetermined temperature $T_2$, for example, 200° C.

The wafer W carried into the DCC processing unit 13 by the main carrier unit 5 is first delivered to the raising and decreasing pins 28 which previously ascended and have been waiting. Thereafter, the cover 21 descends and forms the high-temperature heating chamber 23 and the temperature decreasing chamber 24 integrally with the base 20. At this time, jets of nitrogen gas from the blowout ports 30 on the high-temperature heating chamber 23 side and the supply port 45 on the temperature decreasing chamber 24 side start, and an ascending current is formed in each processing chamber. As a result, a low-oxygen atmosphere with a predetermined concentration, for example, 10 ppm is maintained in each processing chamber. Subsequently, the lid body 31 descends to form the low-oxygen chamber S. The raising and decreasing pins 28 then descend, and the wafer W is mounted on the heating plate 25 maintained at 450° C. and the heating of the wafer W starts. Incidentally, the oxygen concentration in the low-oxygen chamber S at the time of this heating is maintained, for example, at 10 ppm or less, and preferably at approximately 3 ppm.

Thereafter, the wafer W, on which the coating film is cured by heating the wafer W for a predetermined time, is raised again by the raising and decreasing pins 28 at which time the heating of wafer W ends. At this time, the wafer W is heated to approximately 450° C. When the heating of the wafer W ends, the lid body 31 ascends, the shutter 50 of the partition plate 22 is opened, and then the temperature decreasing plate 35 moves to the position above the heating plate 25 as shown in FIG. 5. By the descent of the raising and decreasing pins 28, the wafer W is mounted on the temperature decreasing plate 35 maintained at 200° C. at which time a decrease in the temperature of the wafer W starts. The temperature decreasing plate 35 which has received the wafer W moves again to the temperature decreasing chamber 24 side and stands by until the temperature of the wafer W is decreased to 200° C.

Thereafter, when the temperature of the wafer W is decreased to 200° C. after a predetermined period of time, the wafer W is moved again to the position above the heating plate 25 by the movement of the temperature decreasing plate 35 and delivered to the raising and decreasing pins 28 there. The wafer W on the raising and decreasing pins 28 is delivered to the main carrier unit 5 without being mounted on the heating plate 25, and carried out of the DCC processing unit 13.

The wafer W carried out of the DCC processing unit 13 is immediately carried to the cooling unit 11 and cooled to a normal temperature, for example, 23° C.

Figure 6:
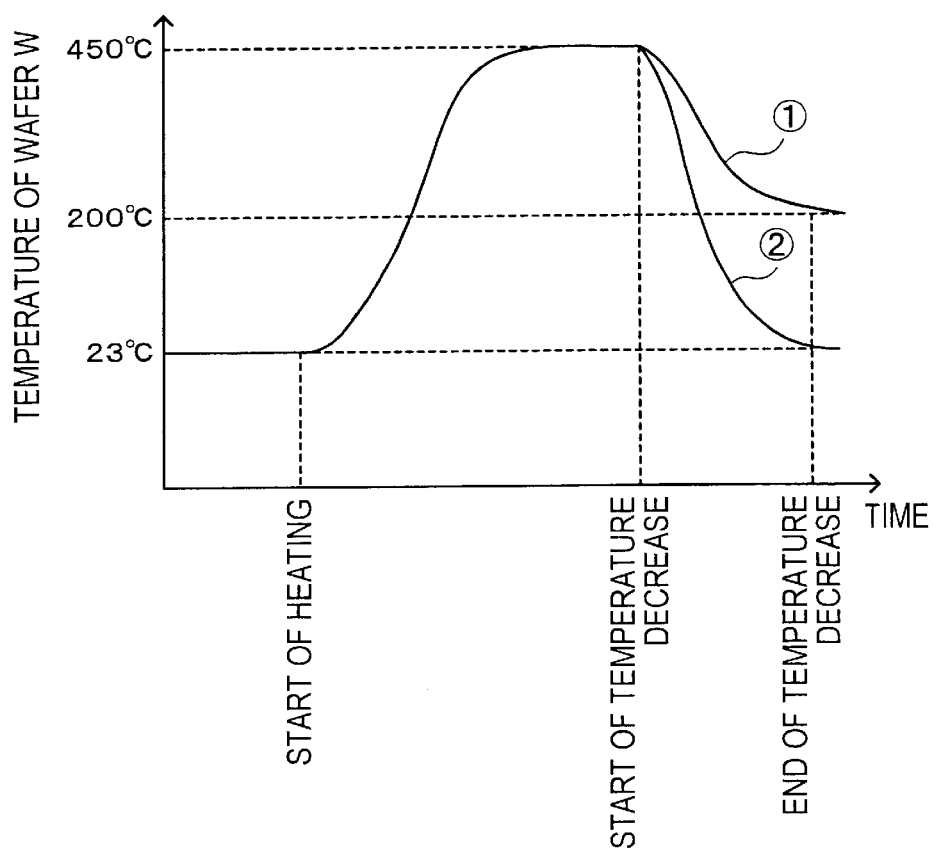
FIG. 6 is a graph showing changes in the temperature of a wafer with the lapse of time in the case of a conventional embodiment and the present embodiment.

In the aforesaid embodiment, as shown in FIG. 6, in the DCC processing unit 13, after the wafer W is heated to a high temperature of 450° C., the temperature of the wafer W can be temporarily decreased to 200° C. as an intermediate temperature (① in FIG. 6). Accordingly, the processing of rapidly cooling the wafer W, which is heated to 450° C., to 23° C. as in prior arts (② in FIG. 6) is not performed, whereby cracks, warp, and the like in the coating film caused by the rapid cooling can be prevented.

Moreover, by performing final cooling to 23° C. in the cooling unit 11 being another processing unit, it becomes unnecessary to successively change the set temperature of temperature decreasing plate 35 to 23° C., and other wafers W can be processed instead, whereby a rise in throughput is realized.

The temperature decreasing plate 35 can be moved to the position above the heating plate 25 and receive/send the wafer W from/to the heating plate 25, whereby it becomes unnecessary to provide a carrier device additionally, thereby preventing the unit from being complicated and increased in size.

Since the flow of nitrogen gas can be formed in the same direction as that of an ascending current naturally generated by the heat of the temperature decreasing plate 35 by providing the supply port 46 below the temperature decreasing plate 35 and the exhaust port 48 in the upper portion of the cover 21, the flow of the atmospheric current becomes smooth, and the distribution of nitrogen gas concentration in the temperature decreasing chamber 24 is stabilized. Accordingly, heat processing can be performed in a uniform atmosphere within the surface of the wafer W.

Figure 7:
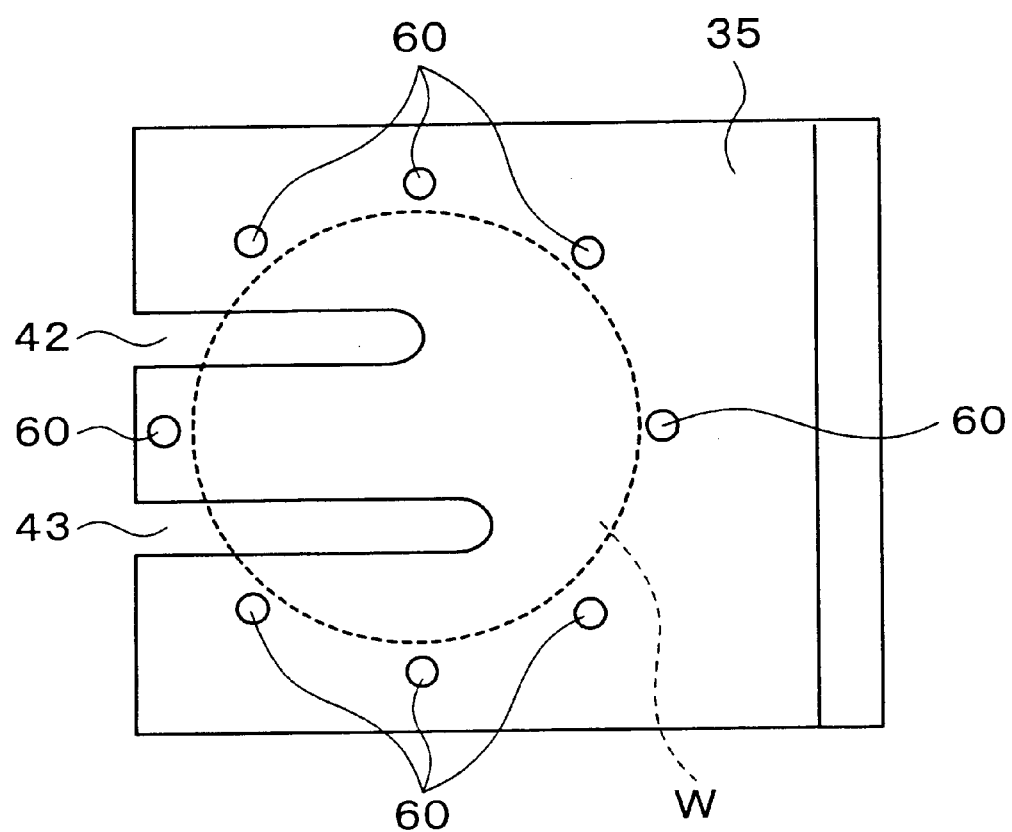
FIG. 7 is a plan view of the temperature decreasing plate when supply ports for nitrogen gas are provided thereon.

Although the supply port 46 for nitrogen gas is provided below the temperature decreasing plate 35 in this embodiment, it may be provided by the side of the temperature decreasing plate 35 or on the temperature decreasing plate 35. When supply ports 60 are provided on the temperature decreasing plate 35 as shown in FIG. 7, for example, they may be provided in a plurality of places along an outer edge portion, for example, on the same circumference of the wafer W mounted on the temperature decreasing plate 35. In such a case, nitrogen gas is jetted close by the wafer W, whereby a low-oxygen atmosphere can be quickly and certainly maintained in the vicinity of the surface of the wafer W.

Figure 8:
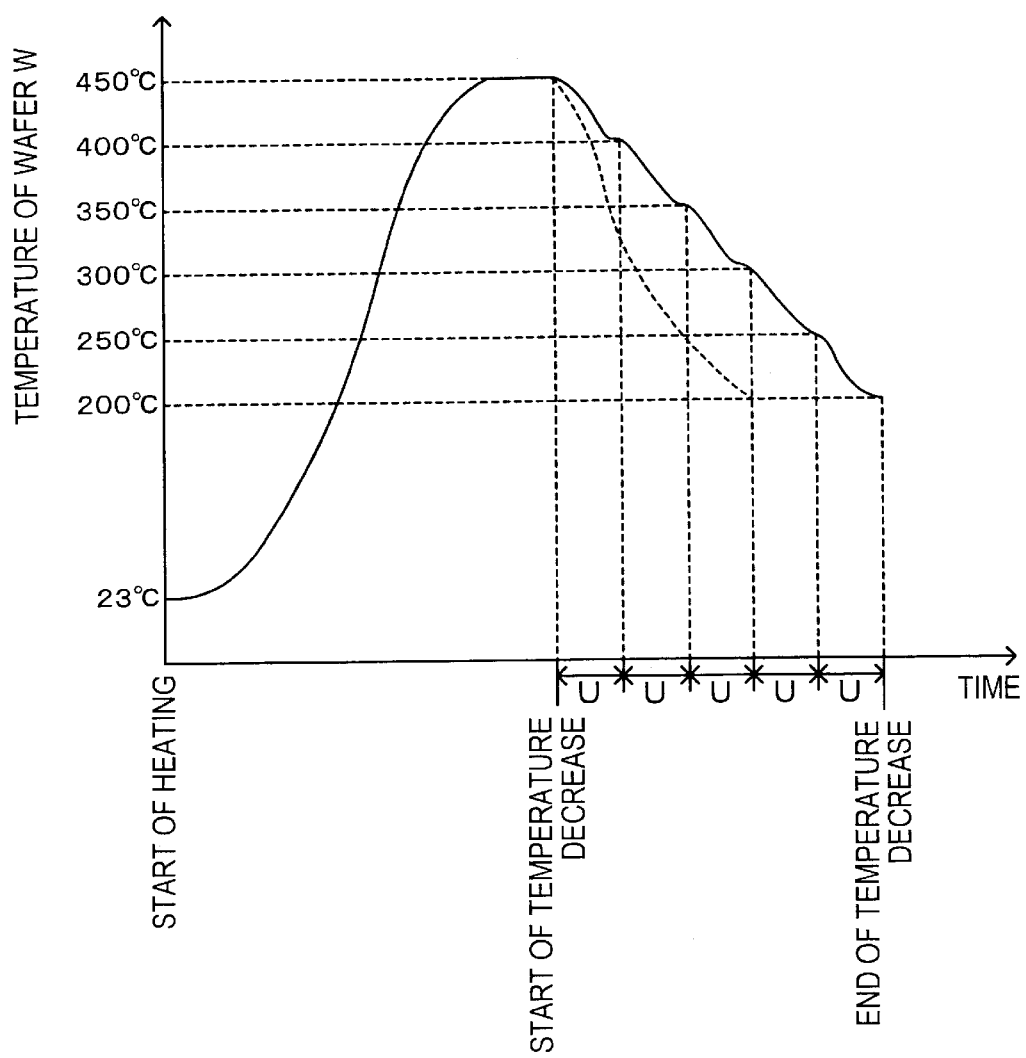
FIG. 8 is a graph showing a change in the temperature of the wafer with the lapse of time when the temperature of the temperature decreasing plate is gradually decreased.

In the aforesaid embodiment, the temperature of the temperature decreasing plate 35 may be freely changeable by the controller 38 of the heater 36 in the temperature decreasing plate 35, in which case, for example as shown in FIG. 8, the set temperature of this controller 38 is gradually decreased whenever a predetermined time U passes. When the temperature of the wafer W is decreased from 450° C. to 200° C. as described in the aforesaid embodiment, the temperature of the temperature decreasing plate 35 is not set at 200° C. from the beginning, but it is set at 400° C. at the beginning. After a lapse of the predetermined time U which is required to lower the temperature of the wafer W on the temperature decreasing plate 35 to 400° C., the set temperature of the temperature decreasing plate 35 is changed to 350° C. Furthermore, every time the predetermined time U passes, the set temperature of the temperature decreasing plate 35 is changed to 300° C., 250° C., and finally to 200° C., and the temperature of the wafer W on the temperature decreasing plate 35 is decreased to 200° C.

In such a case, compared with the case where the temperature of the wafer W heated to 450° C. is rapidly decreased nonstop to 200° C. (a dotted line in FIG. 8) which is described in the aforesaid embodiment, the temperature decreasing speed is further reduced, and hence the temperature of the wafer W can be decreased more gradually. Accordingly, cracks and a warp in the coating film on the wafer W caused by rapid cooling can be further prevented. Incidentally, instead of decreasing the set temperature of the temperature decreasing plate 35 whenever the predetermined time passes, the set temperature may be gradually decreased continuously from the beginning.

Next, another embodiment will be explained. In the DCC processing unit 13 shown in FIG. 9 and FIG. 10, a cover 51 which covers the temperature decreasing plate 35 with its front face open is attached to the temperature decreasing plate 35. In addition, inside this cover 51, a supply port 52 for supplying an inert gas, for example, nitrogen gas into the cover 51 is provided.

Figure 11:
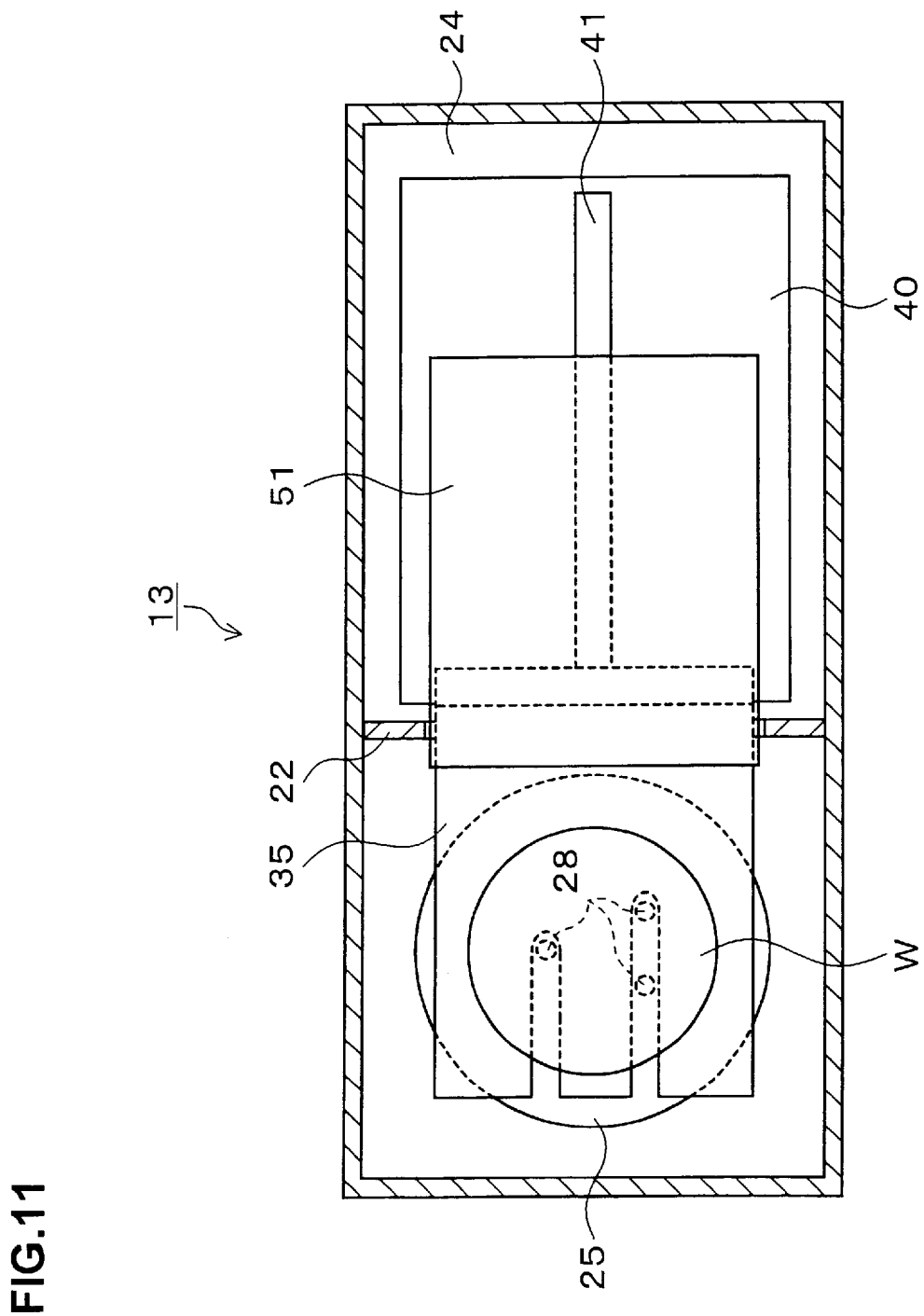
FIG. 11 is an explanatory view of a horizontal section of the DCC processing unit showing a state in which the temperature decreasing plate is moved to the high-temperature heating chamber side in the DCC processing unit in FIG. 9.

The cover 51 moves integrally with the temperature decreasing plate 35, but as shown in FIG. 11, when the temperature decreasing plate 35 moves into the high-temperature heating chamber 23 to receive the wafer W on the heating plate 25, only the cover 51 stops on this side of the heating plate 25.

According to the DCC processing unit 13 having such a cover 51, the temperature decreasing plate 35 is covered with the cover 51, and hence a space above the temperature decreasing plate 35 becomes smaller than that in the unit in FIG. 3. Consequently, the quantity of nitrogen gas necessary for the space above the temperature decreasing plate 35 can be reduced.

Figure 9:
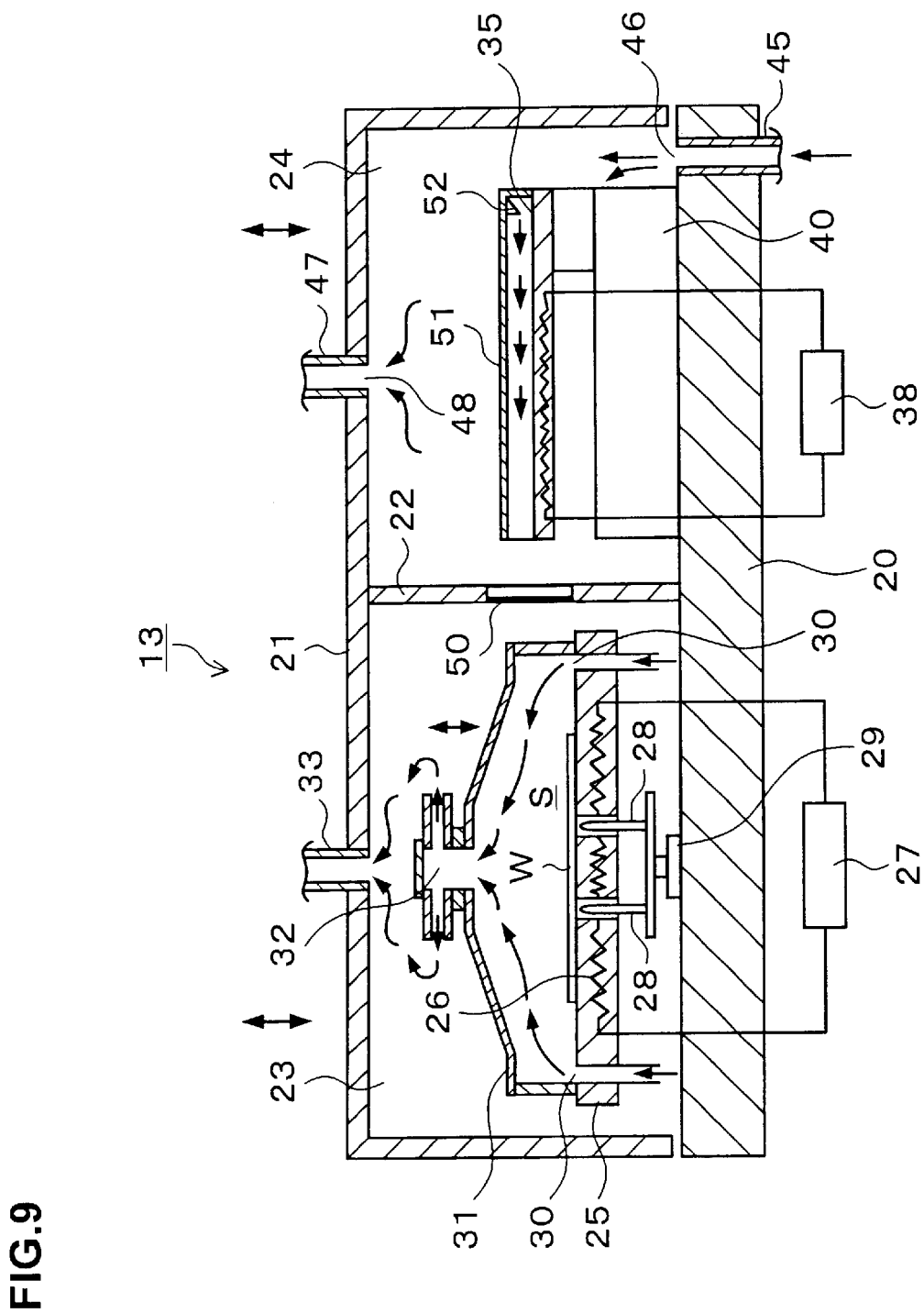
FIG. 9 is an explanatory view of a vertical section showing an outline of the structure of the DCC processing unit having a cover for covering the temperature decreasing plate.
Figure 10:
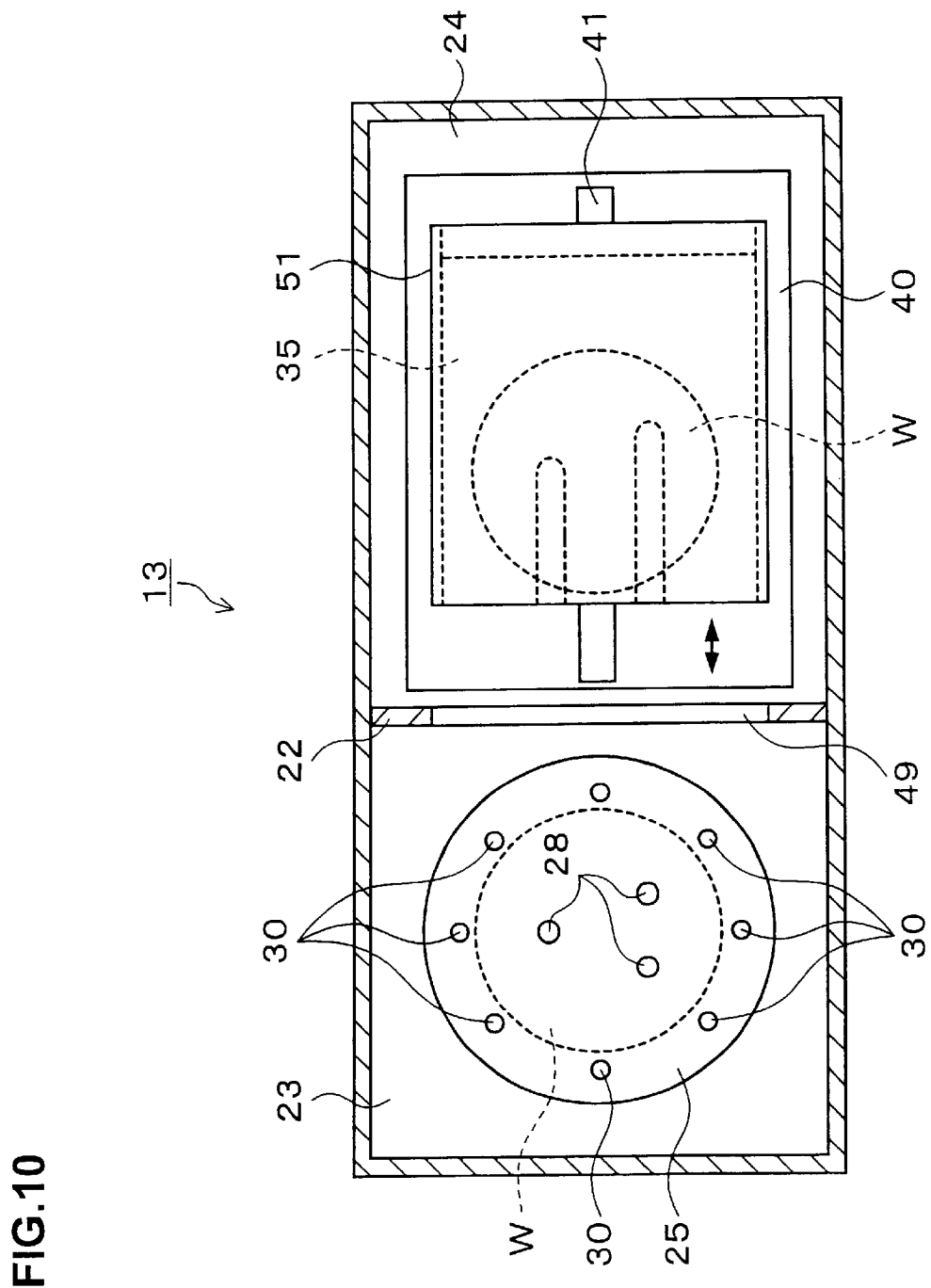
FIG. 10 is an explanatory view of a horizontal section showing an outline of the structure of the DCC processing unit having the cover for covering the temperature decreasing plate.

In the example in FIG. 9, nitrogen gas is supplied from the supply port 52 inside the cover 51, whereby a necessary low-oxygen concentration is obtained. Nitrogen gas is, however, supplied also from the supply port 46, whereby it is possible to easily realize a low-oxygen concentration sufficient to perform desirable processing more certainly, for example, a low-oxygen concentration of 3 ppm.

Besides, by forming the cover 51 out of a material with a certain measure of reflectance such as stainless steel, radiation of heat can be made uniform, which makes it possible to lower the temperature of the wafer W on the temperature decreasing plate 35 more uniformly.

The heat processing apparatus described above relates to the DCC processing unit in the SOD system, but the present invention can be also applied to a heat processing apparatus in a developing and coating processing system which performs photolithography processing. Moreover, as for a substrate, the present invention can be applied not only to a disc-shaped substrate such as a wafer but also to a square substrate such as an LCD substrate.

The heating temperature of 450° C. on the high-temperature heating chamber 23 side described in the aforesaid embodiment of the heat processing apparatus corresponds to a predetermined high temperature in a heat processing method of the present invention, and the decreasing temperature of 200° C. on the temperature decreasing chamber 24 side corresponds to a predetermined intermediate temperature, and the cooling temperature of 23° C. in the cooling unit 11 after DCC processing corresponds to a predetermined low temperature.

According to the present invention, when the temperature of a substrate is decreased to a low temperature after the substrate is heated to a high temperature, the temperature of the substrate is decreased to the low temperature after being temporarily decreased from the high temperature to an intermediate temperature, whereby the temperature decreasing speed is reduced, and consequently cracks, a warp, and the like caused by rapidly cooling the substrate can be prevented.

According to the present invention, the temperature of the substrate which is heated by the first plate can be decreased by the second plate provided with the heater. Hence, the temperature can be decreased to a relatively high temperature, whereby the temperature of the substrate can be decreased more gradually than in the prior arts. As a result, cracks and a warp in the substrate caused by rapid cooling are prevented, leading to a rise in yield.

Furthermore, according to the present invention, since a predetermined gas can be supplied to the processing chamber, the substrate can be processed in a predetermined atmosphere, whereby heat processing of the substrate can be performed desirably, leading to a rise in yield.

What is claimed is:

1. A method for subjecting a substrate on which a coating film is formed to heat processing, comprising the steps of:
   heating the substrate to a predetermined high temperature; and
   decreasing the temperature of the substrate to a predetermined low temperature,
   wherein in said step of decreasing the temperature of the substrate to the low temperature, a first step of decreasing the temperature of the substrate from the predetermined high temperature to a predetermined intermediate temperature which is a temperature between the predetermined high temperature and the predetermined low temperature and a second step of decreasing the temperature of the substrate from the predetermined intermediate temperature to the predetermined low temperature are performed separately.

2. A method as set forth in claim 1,
   wherein the first step has the step of reducing a temperature decreasing speed.

3. A method as set forth in claim 1,
   wherein said step of heating the substrate to the high temperature and the first step are performed in one processing unit, and the second step is performed in another processing unit.

4. A method as set forth in claim 3,
wherein said step of heating the substrate to the high temperature and the first step are respectively performed in different processing chambers.

5. A method as set forth in claim 4,
wherein the processing chamber where said step of heating the substrate to the high temperature is performed and the processing chamber where the first step is performed are maintained at a low-oxygen concentration not more than a predetermined concentration.

6. A method as set forth in claim 5, further comprising the step of:
supplying an inert gas into the processing chamber where the first step is performed to form an ascending current.

* * * * *